(12) United States Patent
Koyanagi et al.

(10) Patent No.: US 10,872,744 B2
(45) Date of Patent: Dec. 22, 2020

(54) CHARGED PARTICLE BEAM APPARATUS

(71) Applicant: Hitachi High-Tech Corporation, Tokyo (JP)

(72) Inventors: Munekazu Koyanagi, Tokyo (JP); Wataru Suzuki, Tokyo (JP); Toshihide Agemura, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/310,333

(22) PCT Filed: Jun. 17, 2016

(86) PCT No.: PCT/JP2016/068027
§ 371 (c)(1),
(2) Date: Dec. 14, 2018

(87) PCT Pub. No.: WO2017/216941
PCT Pub. Date: Dec. 21, 2017

(65) Prior Publication Data
US 2019/0148105 A1 May 16, 2019

(51) Int. Cl.
*H01J 37/20* (2006.01)
*H01J 37/22* (2006.01)
*H01J 37/28* (2006.01)

(52) U.S. Cl.
CPC .............. *H01J 37/20* (2013.01); *H01J 37/22* (2013.01); *H01J 37/28* (2013.01); *H01J 2237/2002* (2013.01)

(58) Field of Classification Search
CPC .......... H01J 37/20; H01J 37/244; H01J 37/28; H01J 2237/2002; H01J 2237/20207;
(Continued)

(56) References Cited

U.S. PATENT DOCUMENTS

| 4,818,874 A * | 4/1989 | Ishikawa ............... H01J 37/244 250/310 |
| 5,481,111 A * | 1/1996 | Rosar ..................... H01J 37/20 250/311 |

(Continued)

FOREIGN PATENT DOCUMENTS

| CN | 104810230 A | 7/2015 |
| JP | 4-106853 A | 4/1992 |

(Continued)

OTHER PUBLICATIONS

Japanese-language Office Action issued in counterpart Japanese Application No. 2018-241934 dated Oct. 8, 2019 with English translation (six (6) pages).

(Continued)

*Primary Examiner* — Wyatt A Stoffa
(74) *Attorney, Agent, or Firm* — Crowell & Moring LLP

(57) ABSTRACT

In a charged particle beam apparatus is provided with an optical image capturing apparatus having an angle different from that of a column, a sample may collide with other components when the sample is faced toward the optical image capturing apparatus. The charged particle beam apparatus includes a stage configured to place a sample thereon and to move the sample inside a sample chamber; a column configured to observe the sample by irradiating a charged particle beam on the sample; a first image capturing apparatus configured to observe a surface of the sample irradiated with the charged particle beam from an angle different from that of the column; and a control unit configured to, when observing the sample via the first image capturing apparatus, separate the sample from the column and to tilt the sample through the stage to face toward the first image capturing apparatus.

10 Claims, 6 Drawing Sheets

(58) Field of Classification Search
CPC ... H01J 2237/20214; H01J 2237/20221; H01J 37/22; H01J 2237/2482

See application file for complete search history.

(56) References Cited

U.S. PATENT DOCUMENTS

| | | | |
|---|---|---|---|
| 6,172,363 B1* | 1/2001 | Shinada | G01R 31/305 |
| | | | 250/307 |
| 7,952,082 B2* | 5/2011 | Sugizaki | H01J 37/3056 |
| | | | 250/492.1 |
| 2005/0139781 A1* | 6/2005 | Hazaki | G01R 31/2891 |
| | | | 250/442.11 |
| 2008/0073524 A1* | 3/2008 | Nishiyama | G02B 21/0016 |
| | | | 250/307 |
| 2009/0039285 A1* | 2/2009 | Cooper | H01J 37/20 |
| | | | 250/442.11 |
| 2011/0260057 A1 | 10/2011 | Otaka et al. | |
| 2012/0001069 A1 | 1/2012 | Kashihara | |
| 2012/0074319 A1* | 3/2012 | Nishiyama | G02B 21/0016 |
| | | | 250/307 |
| 2012/0074320 A1* | 3/2012 | Biberger | H01J 37/20 |
| | | | 250/309 |
| 2013/0075606 A1* | 3/2013 | Uemoto | H01J 37/261 |
| | | | 250/310 |
| 2013/0335817 A1* | 12/2013 | Isobe | G01N 23/2251 |
| | | | 359/363 |
| 2014/0231670 A1* | 8/2014 | Cyrankowski | G01N 3/42 |
| | | | 250/442.11 |
| 2015/0060664 A1* | 3/2015 | Man | G01N 23/20091 |
| | | | 250/307 |
| 2015/0144804 A1* | 5/2015 | Ando | H01J 37/20 |
| | | | 250/442.11 |
| 2015/0214001 A1 | 7/2015 | Buijsse | |
| 2016/0163504 A1* | 6/2016 | Takeda | H01J 37/265 |
| | | | 250/307 |
| 2016/0356729 A1* | 12/2016 | Bauer | H01J 37/3056 |
| 2017/0030812 A1* | 2/2017 | Cyrankowski | G01N 3/04 |
| 2017/0316915 A1* | 11/2017 | Okai | H01J 37/20 |
| 2019/0155175 A1* | 5/2019 | Shibazaki | G03F 7/70641 |

FOREIGN PATENT DOCUMENTS

| | | |
|---|---|---|
| JP | 2007-200931 A | 8/2007 |
| JP | 2010-108640 A | 5/2010 |
| JP | 2010-198998 A | 9/2010 |
| JP | 2012-15027 A | 1/2012 |
| JP | 2015-23005 A | 2/2015 |
| JP | 2015-141899 A | 8/2015 |
| WO | WO 2015/030271 A1 | 3/2015 |

OTHER PUBLICATIONS

Chinese-language Office Action issued in Chinese Application No. 201680086707.6 dated Mar. 12, 2020 with English translation (12 pages).

International Search Report (PCT/ISA/210) issued in PCT Application No. PCT/JP2016/068027 dated Sep. 20, 2016 with English translation (two (2) pages).

Japanese-language Written Opinion (PCT/ISA/237) issued in PCT Application No. PCT/JP2016/068027 dated Sep. 20, 2016 (three (3) pages).

\* cited by examiner

FIG. 1
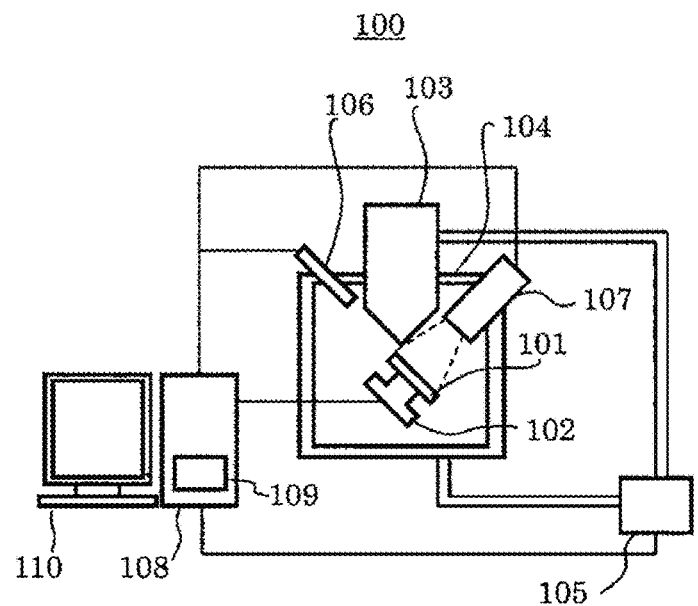
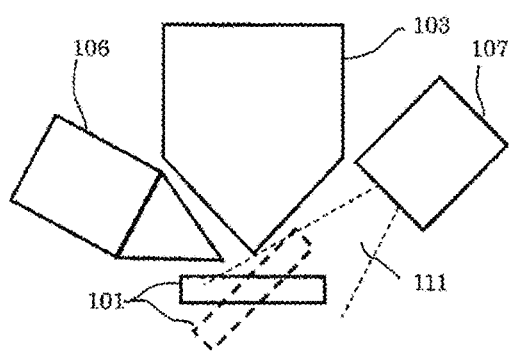
Fig. 2A
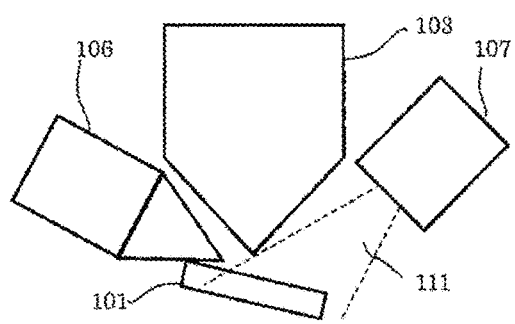
Fig. 2B
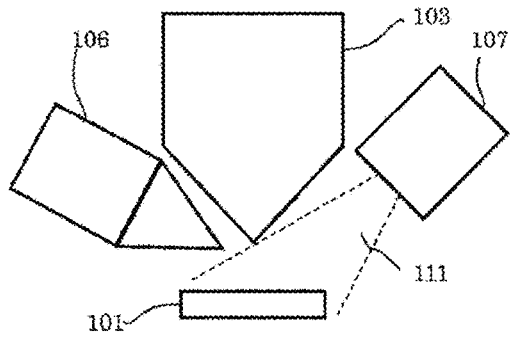
Fig. 2C
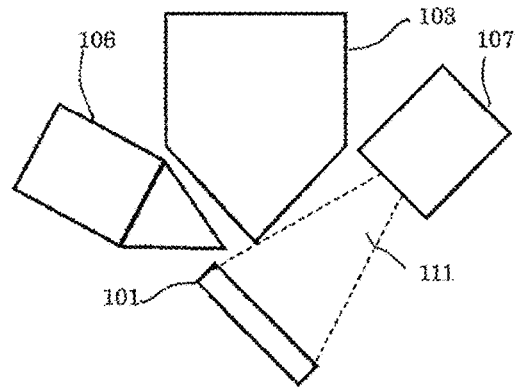
Fig. 2D FIG. 8
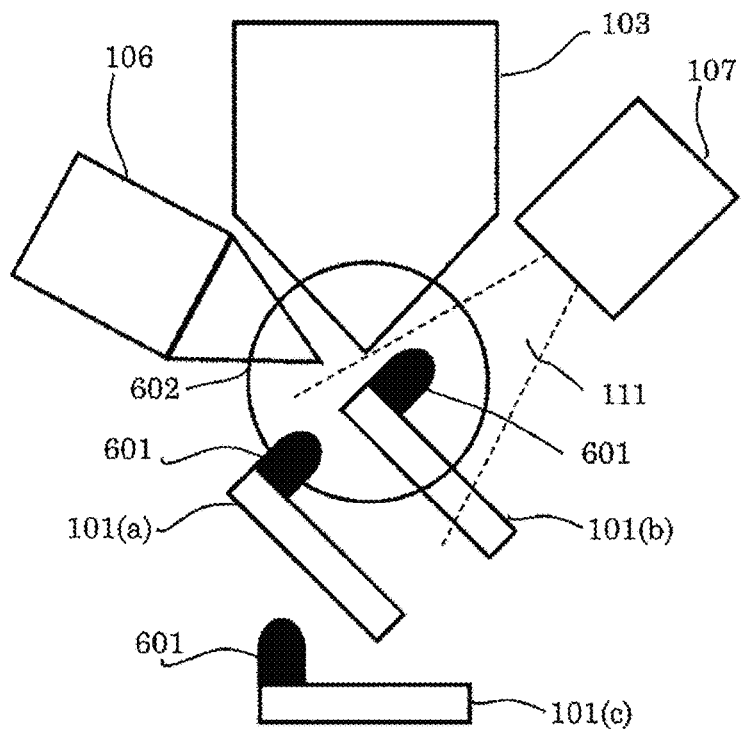
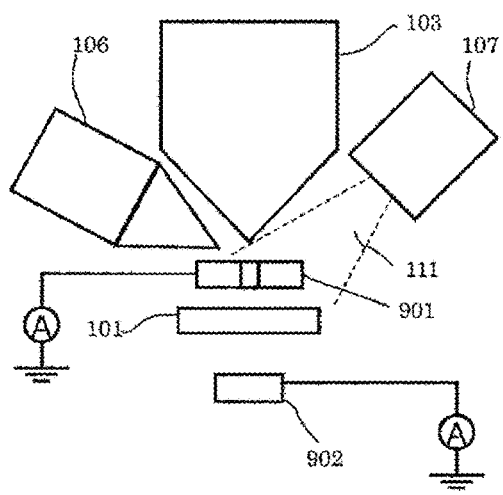
Fig. 9A
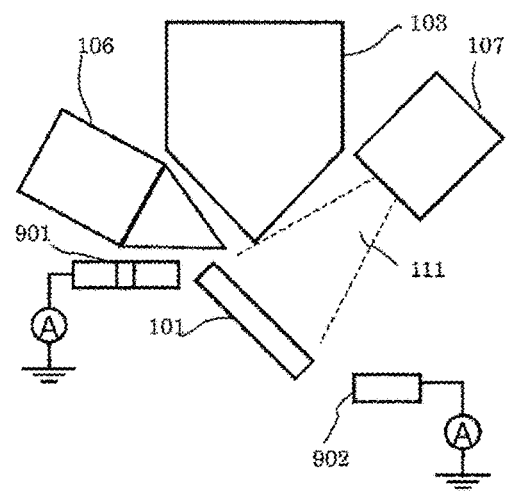
Fig. 9B

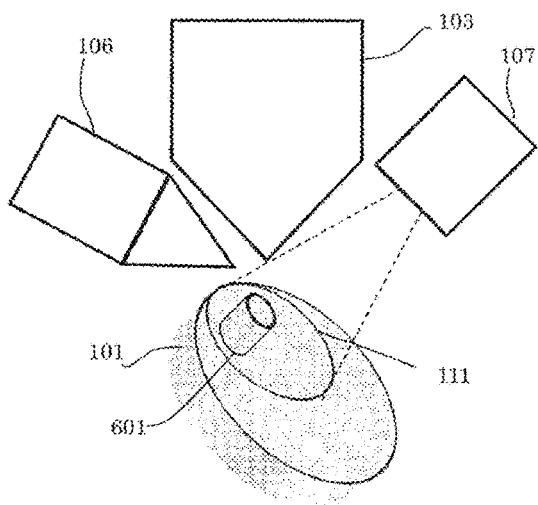
Fig. 10A
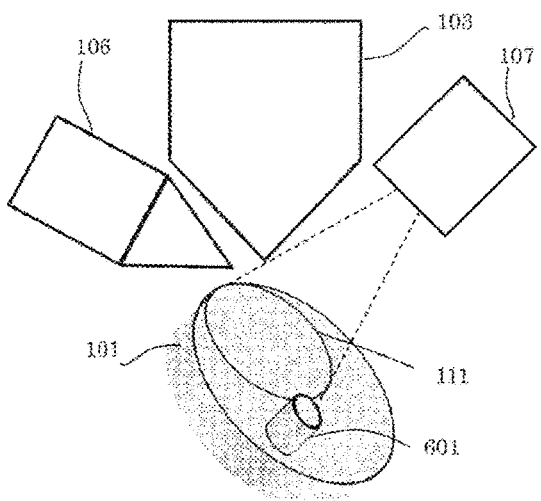
Fig. 10B
FIG. 11
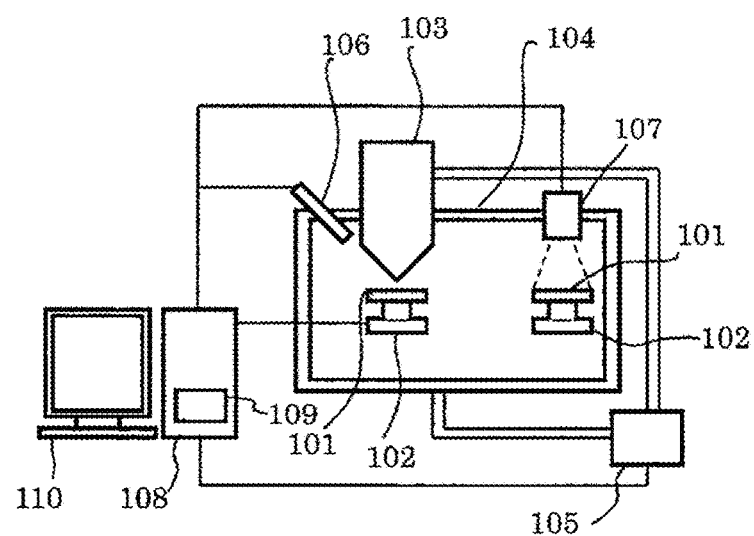

CHARGED PARTICLE BEAM APPARATUS

TECHNICAL FIELD

The present invention relates to a charged particle beam apparatus.

BACKGROUND ART

A scanning electron microscope (hereinafter referred to as SEM), which is a kind of charged particle beam apparatus, is an apparatus for observing an surface image of a sample by irradiating an electron beam emitted from an electron source on the sample.

PTL 1 discloses a SEM in which a sample is tilted when the sample is to be observed by an optical microscope (hereinafter referred to as OM) in order to coincide an angle of observation of the SEM with that of the OM.

PTL 2 discloses a SEM that rotates a column of SEM and a sample chamber equipped with OM instead of rotating a sample.

CITATION LIST

Patent Literature

PTL 1: JP-A-4-106853
PTL 2: JP-A-2012-15027

SUMMARY OF INVENTION

Technical Problem

The SEM of PTL 1 is designed to be used in an IC manufacturing process. Since an IC wafer, which is a target of observation, is almost uniformly flat and the size thereof is always uniform, a condition for tilting a sample so as not to collide with other components can be determined in advance. However, in a general-purpose SEM for observing samples with different sizes and heights, there is a possibility that a sample collides with other components when the sample is tilted.

In the technique disclosed in PTL 2, a column of a SEM and an optical microscope are movable. Therefore, the column of the SEM needs to be light-weighted, and thus it is difficult to mount a high-performance column.

An object of the present invention is to provide a charged particle beam apparatus capable of properly observing samples even when observing samples with different sizes and heights.

Solution to Problem

According to an aspect of the present invention, a charged particle beam apparatus includes a stage configured to place a sample thereon and to move the sample inside a sample chamber; a column configured to observe the sample by irradiating a charged particle beam on the sample; a first image capturing apparatus configured to observe a surface of the sample irradiated with the charged particle beam from an angle different from that of the column; and a control unit configured to, when observing the sample via the first image capturing apparatus, separate the sample from the column and to tilt the sample through the stage so as to face toward the first image capturing apparatus.

Advantageous Effect of Invention

According to the present invention, a charged particle beam apparatus capable of properly observing samples even when observing samples with different sizes and heights can be provided.

BRIEF DESCRIPTION OF DRAWINGS

FIG. 1 is a diagram illustrating a charged particle beam apparatus.
FIGS. 2A-2D are diagrams illustrating a movement of a sample of a SEM.
FIG. 8 is a diagram illustrating a movement of a sample when a sample collision probability is high.
FIGS. 9A and 9B are diagrams illustrating a SEM including a detector in the vicinity of a sample.
FIGS. 10A and 10B are diagrams illustrating a movement of a sample when the sample is larger than the field of view of an image capturing apparatus.
FIG. 11 is a diagram illustrating a conventional charged particle beam apparatus.

DESCRIPTION OF EMBODIMENTS

Figure 3:
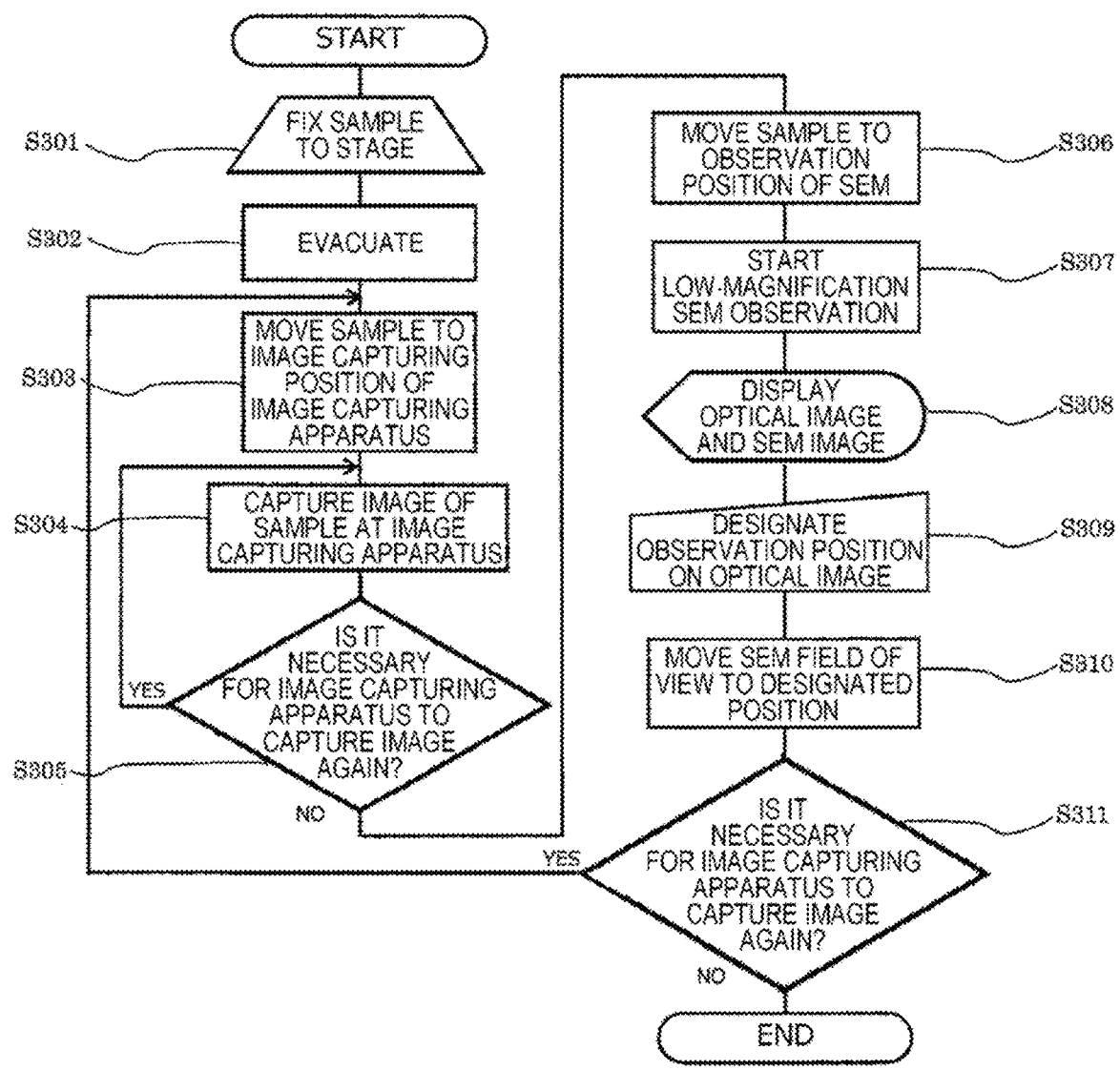
FIG. 3 is a flowchart illustrating the procedure of searching for a field of view.

A SEM is characterized in that resolution and magnification can be increased as compared with an ordinary OM, and is suitable for observing a fine structure from several mm to several nm. Before observing a sample with a high resolution by using a SEM, it is necessary to observe the sample in a state where the magnification of the SEM is set to low and to specify a part to be observed to some extent.

However, the minimum magnification of a SEM is greater than that of an OM (SEM has a narrower field of view than OM). The minimum magnification depends on the configuration of the apparatus. For example, the minimum magnification of an OM is about 1 to 3 times, whereas the minimum magnification of a SEM is about 10 to 50 times. Because of the minimum magnification, when a user observes a large sample with SEM, it is difficult to grasp the entire appearance of the sample and to recognize a position of the sample at which a current field of view of the SEM is located.

Therefore, there is a technique to find a field of view of a SEM by installing an OM at a titled position in a sample chamber of the SEM and comparing an image obtained by the OM (hereinafter referred to as an OM image) with an image obtained by the SEM (hereinafter referred to as a SEM image). In this case, the observation angle of the SEM is different from that of the OM.

The "magnification" in a SEM is a value defined by "how many times of the size the SEM scanning range of a field of view under observation is displayed". Theoretically, by changing the display size of a SEM image, an arbitrary magnification can be implemented regardless of the size of a field of view. In the present specification, the magnification is described under an assumption that the SEM image is displayed with a certain size on a common size monitor for a PC (that is, the field of view is wide if the magnification is low).

Here, electron sources of the SEM include a thermoelectron type, a Schottky type, a field emission type, and the like. In any of the electron sources, it is necessary to prevent burnout of a filament and adhesion of gas to the electron source. Also, in a low vacuum region, an electron beam collides with residual gas molecules and is scattered. Therefore, when observing a sample with a SEM, a column and a sample chamber of the SEM are maintained in vacuum.

In order to vacuum-evacuate an electron source, a column, and a sample chamber, a common SEM has a column fixed to a sample chamber. Therefore, the column cannot be moved with respect to the sample chamber, and thus an irradiation direction and an irradiation point of an electron beam are fixed. Therefore, it is not realistic, for example, to widen the observation field of view by extremely increasing the distance between a sample and the column, and there is an upper limit in the field of view of a SEM (there is a lower limit in the magnification).

Usually, the diameter of a hole at the front end of a column of a SEM is about several mm. Even if an electron beam is scanned in a region wider than the diameter of the hole, the electron beam is obstructed by the column and is not irradiated onto the sample. Therefore, the (practical) upper limit of the field of view of a SEM is about several mm square (from 10 to 50 times when expressed in magnification).

When observing a sample of several cm square or larger, it is difficult for a SEM which can obtain a field of view of only a few mm square at the most to grasp the entire appearance of the sample and to recognize a position of the sample at which the current field view is located. Therefore, when observing a sample of several mm square or larger, it takes a huge amount of time to specify a location to be observed only with a SEM. Furthermore, unlike an OM, a SEM image is a monochrome image, and thus the color of a sample surface cannot be observed. In order to solve these problems, there is a technique to search for a field of view of a SEM by comparing an OM image with a SEM image.

FIG. 11 illustrates an example of a conventional charged particle beam apparatus. In a sample chamber 104 of the SEM in FIG. 11, an image capturing apparatus 107 facing in the same direction as a column 103 is provided. The image capturing apparatus 107 may be provided not in the sample chamber 104, but in a sample exchange chamber (not illustrated) or the like. When a stage 102 constitutes a part of the sample chamber 104 or the like, the image capturing apparatus 107 may be provided at the stage 102. A user moves a sample 101 to a prescribed position (right below the image capturing apparatus 107) by using the stage 102 and captures an optical image of the sample 101.

According to the configuration, since the sample 101 and the image capturing apparatus 107 are not removed, there is no problem of a mechanical mounting error at the time of placing the sample 101 on the stage 102. In addition, since the sample 101 always exists inside the sample chamber, complicated tasks such as atmospheric exposure and evacuation do not occur.

On the other hand, with this technique, it is necessary to examine the arrangement and the shapes of the column 103, a detector 106, and the like so as not to obstruct the field of view of the image capturing apparatus 107. Also, since the heights of the sample 101 and the image capturing apparatus 107 are fixed, the field of view of the image capturing apparatus 107 is restricted. Furthermore, as the image capturing apparatus 107 is installed, the overall size of the SEM is increased.

Embodiments will be described below. The "image" in the embodiments includes not only a still image, but also a moving picture (video).

First Embodiment

FIG. 1 is a diagram illustrating a charged particle beam apparatus including a SEM and an image capturing apparatus. A charged particle beam apparatus 100 includes a stage 102 on which a sample 101 is placed, a column 103 for irradiating an electron beam onto the sample 101, a sample chamber 104 for maintaining the interior in vacuum, a vacuum pump 105 for evacuating the sample chamber 104, a detector 106 for detecting electrons, X-rays and the like, an image capturing apparatus 107 for capturing an optical image, a monitor (display unit) 110 for displaying a SEM image, an optical image, and the like, and a control unit 108 for controlling the components.

Since an arbitrary position of the sample having various shapes is observed, the stage 102 can be titled, rotated, planarly moved, and vertically moved with respect to an electron beam.

As the detector 106, a secondary electron detector, an X-ray detector, a cathode luminescence detector, a low vacuum secondary electron detector, a reflection electron detector, and the like can be employed. Incidentally, the detector 106 may include a combination of a plurality of these detectors.

The image capturing apparatus 107 captures an image of the entire appearance of the sample 101 and stores an optical image acquired therefrom in a memory 109 equipped in the control unit 108. The optical image is displayed on the monitor 110 by the control unit 108. By associating the optical image with the coordinates of the stage 102 in advance, an observation position in the SEM can be designated using an image of an equal magnification or a low magnification by the image capturing apparatus 107. Furthermore, color information of the sample 101, which cannot be obtained via the SEM, can be obtained. The image capturing apparatus 107 may be anything capable of capturing an optical image, such as an OM, a CCD camera, an infrared camera, or the like.

According to the above configuration, an image of the sample 101 in a state where the sample 101 is disposed right below the column 103 can be captured. Also, since it is not necessary to move the stage 102 by a large amount in the horizontal direction, the size of the SEM can be reduced. Although an example in which the stage 102 is tilted to capture an optical image has been illustrated, an optical image may also be captured while maintaining the stage 102 horizontal.

Here, as illustrated in FIG. 1, since the distance between the image capturing apparatus 107 and the column 103 is small, the field of view of the image capturing apparatus 107 is obstructed by the column 103 and the like. In addition, when the image capturing apparatus 107 captures an image while maintaining the stage 102 horizontal, an observation angle of the column 103 is different from that of the image capturing apparatus 107, and thus the image needs to be corrected after being captured.

Furthermore, in the case of capturing an optical image by tilting the stage 102, if the height and the size of a sample are fixed, a condition for tilting the sample 101 to prevent the sample 101 from colliding with other components can be determined in advance. However, in a general-purpose SEM for observing samples with different sizes and heights, there is a possibility that a sample collides with other components when the sample is being tilted.

FIG. 2 is a diagram illustrating a movement of a sample of a SEM. FIG. 2(A) illustrates a case where the sample 101 is observed by a SEM. In order to observe the sample 101 with a high resolution, it is preferable that a working distance (the distance between the front end of an object lens and the sample) is small, and thus the sample 101 and the column 103 are arranged to be close to each other. On the other hand, in this example, a field of view 111 of the image capturing apparatus 107 is restricted by the column 103. Therefore, the image capturing apparatus 107 cannot observe the entire appearance of the sample 101.

Furthermore, in a SEM, there is a case that the sample 101 is tilted toward the detector 106 in order to increase a signal amount by the tilt effect, to irradiate an electron beam to side surfaces of a concave-convex portion on which is not irradiated with an electron beam from right above, or to stereoscopically observe the sample 101. In FIG. 2(A), the sample 101 tilted toward the detector 106 is indicated by a dotted line. In such a case, the image capturing apparatus 107 cannot observe the surface of the sample 101.

In order to observe the sample 101 with the image capturing apparatus 107, the sample 101 may be tilted toward the image capturing apparatus 107. FIG. 2B illustrates a schematic view of the case where the sample 101 is tilted toward the image capturing apparatus 107. In this example, as the sample 101 is tilted, since an end portion of the sample 101 collides with the detector 106, the sample 101 cannot be sufficiently tilted.

Next, FIG. 2C illustrates a schematic view of a movement of sample 101 in this example. When observing the sample 101 with the image capturing apparatus 107, the control unit 108 moves the sample 101 by using the stage 102, such that the sample 101 is within the field of view 111 of the image capturing apparatus 107. First, by lowering the position of the sample 101 (moving in a direction away from the column 103), the sample 101 is within the field of view 111 of the image capturing apparatus 107. Here, although the sample 101 is moved directly downward, the sample 101 may be positioned within the field of view 111 of the image capturing apparatus 107 by a combination of the vertical movement and a horizontal movement of the sample 101.

Since the observation angle of the SEM becomes different from that of the image capturing apparatus 107 only with the movement illustrated in FIG. 2C, an optical image is distorted, and thus the optical image needs to be corrected after being captured. FIG. 2D illustrates a schematic view of an additional movement of the sample 101. In case of observing the sample 101 with the image capturing apparatus 107, the control unit 108 tilts the sample 101 such that the sample 101 faces toward the image capturing apparatus 107. In this case, it is preferable to adjust the vertical position of the sample 101 such that the sample 101 does not collide with the components inside the SEM.

Next, a procedure for searching for a field of view of the present embodiment will be described with reference to FIG. 3.

Step S301: A user places the sample 101 on the stage 102. If the stage 102 is detachable from the sample chamber 104, the stage 102 is fixed to the sample chamber 104.

Step S302: The control unit 108 instructs the vacuum pump 105 to evacuate the sample chamber 104.

Step S303: For example, as illustrated in FIG. 1(D), the control unit 108 moves the stage 102 to a position where the image capturing apparatus 107 can capture an image of the sample 101.

Step S304: The control unit 108 instructs the image capturing apparatus 107 to capture an optical image of the sample 101 and stores the optical image in the memory 109.

Step S305: If it is determined that the brightness of the optical image is insufficient or the optical image has failed to be stored, the control unit 108 returns to step S304 and captures an image of the sample 101 by the image capturing apparatus 107 again. In this case, the control unit 108 reads information of the optical image to determine whether or not it is necessary to capture an optical image again. However, for example, the optical image may be displayed on the monitor 110 such that a user determines whether or not it is necessary to capture an optical image again.

Step S306: If it is determined that it is not necessary to capture an optical image again, the control unit 108 issues an instruction to the stage 102, thereby moving the sample 101 to a SEM observation position (for example, a position right below the column 103, or the like). In other words, the sample 101 is tilted to face the column 103 and brought closer to the column 103.

Step S307: The control unit 108 issues an instruction to the column 103 and other components of the SEM, thereby starting observation of the sample 101 at a low magnification.

Step S308: The control unit 108 displays the optical image stored in the memory 109 and a SEM image obtained by the detector 106 and the like on the monitor 110.

Step S309: From the optical image displayed on the monitor 110, the user designates a position to be observed by the SEM.

Step S310: The control unit 108 moves the stage 102 such that the field of view of the SEM covers the position specified in step S309.

Step S311: The user determines whether the position designated on the optical image is observed by the SEM. For example, when there is a coordinate deviation in the optical image and the optical image does not coincide with the SEM image, the process returns to step S303 and an optical image is captured again. If the position designated on the optical image is observed by the SEM, the field-of-view search is terminated and a normal SEM observation is started.

Figure 4:
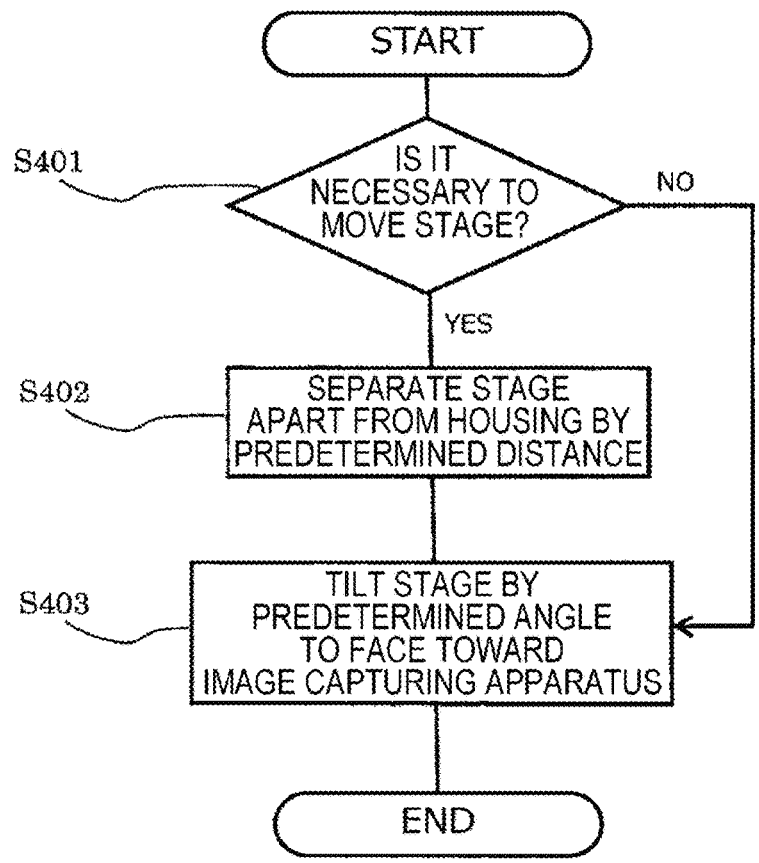
FIG. 4 is a flowchart illustrating the details of step S303.

Next, a detailed flow of step S303 will be described with reference to FIG. 4.

The control unit 108 determines whether to move the stage 102 (step S401). If it is determined that it is necessary to move the stage 102, the process proceeds to step S402. If it is determined that it is not necessary to move the stage 102, the process proceeds to step S403. When the size of a sample is known beforehand (for example, in the case of the second embodiment described below), the control unit 108 may make a determination according to the size of the sample and may move the sample according to an instruction from the user. If it is inevitable to move a sample due to a reason such as the layout of the charged particle beam apparatus 100, this step may be omitted.

In step S402, the control unit 108 separates the stage 102 from the column 103 by a predetermined distance.

Next, the control unit 108 tilts the stage 102 by a predetermined angle to face the image capturing apparatus 107 (step S403). Next, the control unit 108 proceeds to step S304.

Here, the predetermined distance in step S402 and the predetermined angle in step S403 may be a unique value depending on the layout of the charged particle beam apparatus 100, a value determined depending on the size of the sample 101, or an arbitrary value calculated depending on other various conditions. In addition, the data may be stored in the memory 109 or may be stored in a storage device outside the control unit 108.

The above is the procedure for searching for a field of view by a SEM. Also, in step S308, after only the optical image is displayed and a user designates an observation position, a SEM observation may be started. Additionally, other steps can be added, omitted, replaced, or modified.

According to the present embodiment, an optical image can be obtained without replacing a sample between an image capturing operation by the image capturing apparatus 107 and an observation by the SEM, and repeating the atmospheric exposure and evacuation. Therefore, observation efficiency improves. Since an atmospheric exposure process is not performed, corruption of the sample 101 by the atmosphere can be prevented. In addition, since the image capturing apparatus 107 is provided in the sample chamber 104 in a tilted state, the size of the sample chamber 104 can be reduced. Furthermore, when an image of the sample 101 is captured by the image capturing apparatus 107, the sample 101 is tilted by the stage 102 to face the image capturing apparatus 107, and thus a distortion does not occur in an optical image. Furthermore, since the control unit 108 tilts the sample 101 after separating the sample 101 and the column 103 and the like by a predetermined distance, it is possible to lower the possibility that the sample 101 collides with other components even when the sample 101 has an indeterminate size or the like.

Second Embodiment

In the second embodiment, a charged particle beam apparatus including a plurality of image capturing apparatuses will be described.

As described above, in order to obtain a high resolution via a SEM, it is preferable that the distance between the sample 101 and the column 103 is short. However, from a SEM image alone, the distance between the sample 101 and the column 103 cannot be determined accurately. Therefore, by providing another image capturing apparatus different from the image capturing apparatus 107 on a side surface of the sample chamber 104 and observing the sample 101 from a position right beside the sample 101, the vertical position of the sample 101 is determined.

Figure 5A:
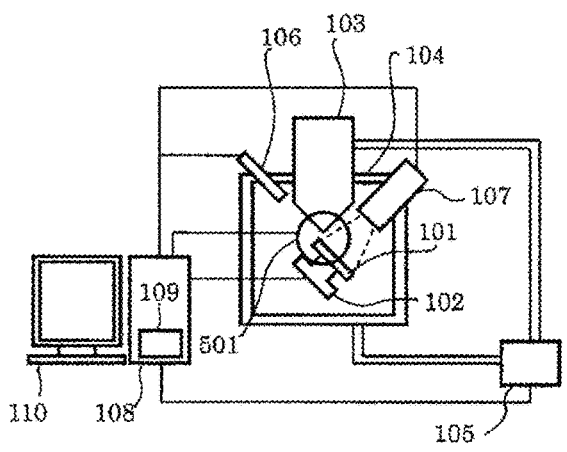
FIGS. 5A and 5B are diagrams illustrating a SEM with a chamber scope.
Figure 5B:
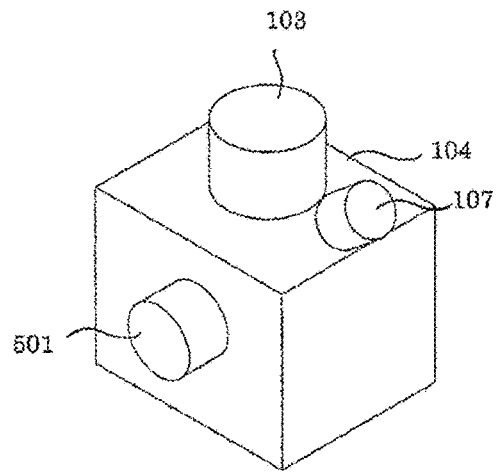

FIG. 5(A) is a schematic view of a charged particle beam apparatus according to the second embodiment, and FIG. 5(B) is a perspective view of the charged particle beam apparatus according to the second embodiment. In addition to the configuration illustrated in FIG. 1, the charged particle beam apparatus 100 includes a second image capturing apparatus for observing the interior of the sample chamber 104 from a direction different from the column 103 and the image capturing apparatus 107. Here, the second image capturing apparatus is described as a chamber scope 501. The chamber scope 501 includes the sample 101, the stage 102, the detector 106, and the like in its field of view in a direction substantially perpendicular to the optical axis of the column 103. A plurality of chamber scopes 501 may be provided to perform observations in various directions.

Figure 6:
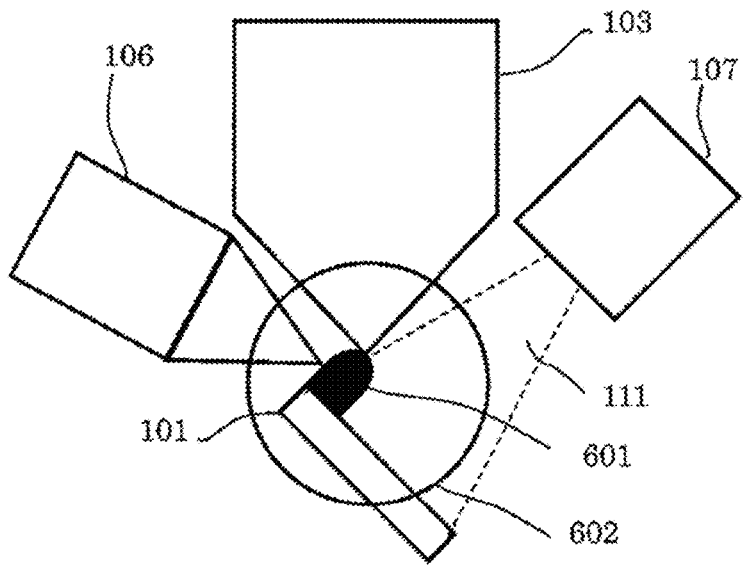
FIG. 6 is a diagram illustrating a sample having a convex portion.

In the first embodiment, an example in which the sample 101 is flat has been illustrated. However, an actual sample may have concave-convex portions. FIG. 6 is a schematic view in case of capturing an image of the sample 101 having a convex portion 601 by the image capturing apparatus 107 according to the technique of the first embodiment. If the protrusion amount of the convex portion 601 is large, there is a possibility that the convex portion 601 collides with other components even if the sample 101 is lowered and then tilted as described in FIG. 2D. Even if the convex portion 601 does not exist, the same may occur when the diameter of the sample 101 is large, for example.

Since the column 103 looks down on the sample 101 from right above and the field of view of a SEM image is narrow, it is difficult not only to determine the protrusion amount of the sample 101 from the SEM image, but also to find the convex portion 601.

Even though the image capturing apparatus 107 is arranged to be slightly tilted, the image capturing apparatus 107 observes the sample 101 from above, and thus it is difficult to determine the protrusion amount of the convex portion 601. Also, in the first embodiment, since the sample 101 is tilted before an image thereof is captured by the image capturing apparatus 107, determination of the protrusion amount of the convex portion 601 by using the image capturing apparatus 107 before tilting the sample is not assumed.

Therefore, in the SEM in the second embodiment, when the sample 101 is tilted in order to capture an optical image thereof by the image capturing apparatus 107, by observing the side surface of the sample 101 by the chamber scope 501, it can be confirmed that (the convex portion 601 of) the sample 101 does not collide with the components like the column 103. In the second embodiment, a field of view 602 of the chamber scope 501 is configured to include the sample 101, the column 103 and the detector 106. However, the field of view 602 may be expanded or narrowed as necessary.

Figure 7:
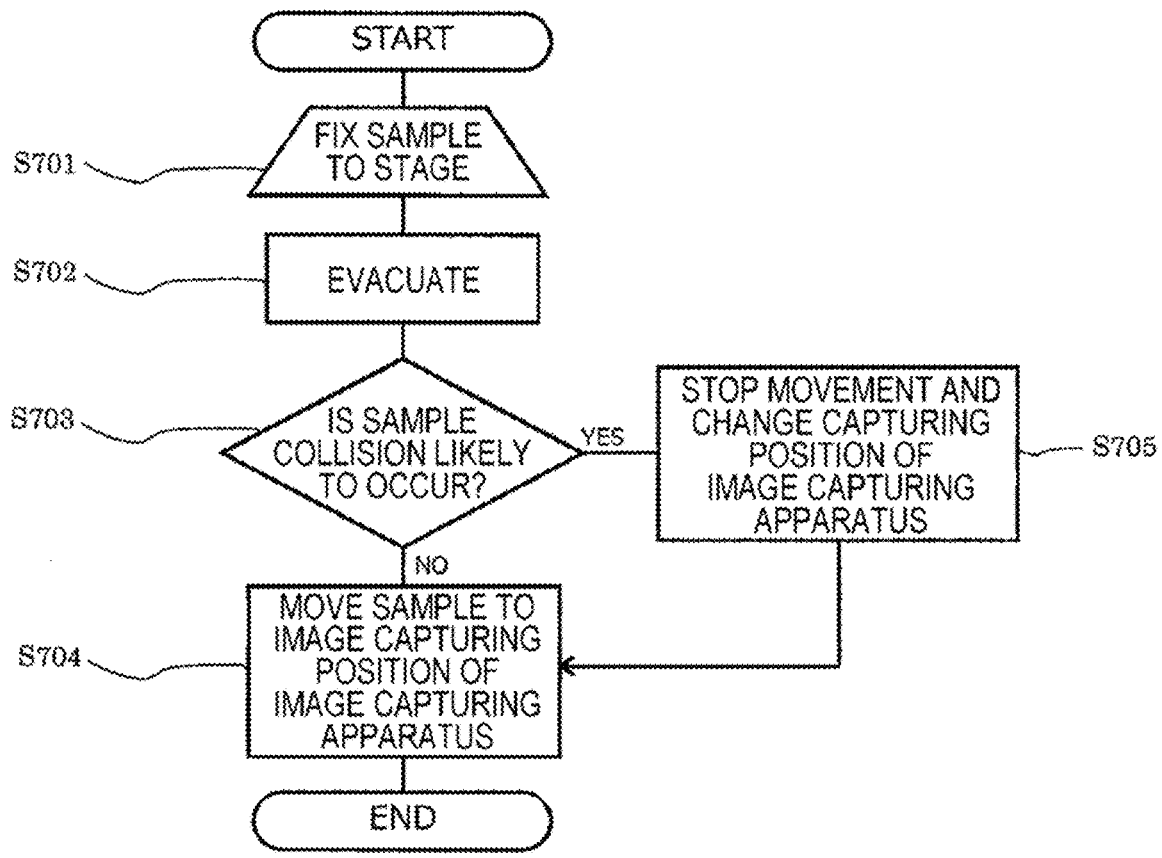
FIG. 7 is a flowchart illustrating the procedure for determining a sample collision possibility.

A method of using the chamber scope 501 in the present embodiment will be described with reference to the flowchart illustrated in FIG. 7.

Steps S701 to S702: Same as steps S301 to S302.

Step S703: The control unit 108 determines whether a collision between the sample 101 and other components is likely to occur based on a captured image of the field of view 602 of the chamber scope 501. Here, the image of the chamber scope 501 may be displayed on the monitor 110, and a user may determine the possibility of collision. The control unit 108 may determine the possibility of collision by using image processing or the like.

Step S704: When a collision between the sample 101 and other components is unlikely to occur (when the possibility of collision is low), the sample 101 is moved to an image capturing position of the image capturing apparatus 107 (same as step S303). The subsequent flow is the same as that in FIG. 3.

Step S705: When a collision between the sample 101 and other components is likely to occur (in the case where the possibility of collision is high), the control unit 108 stops the movement of the stage 102. Then, the image capturing position of the image capturing apparatus 107 is changed to a position where collision does not occur. In this case, as an example, it may be considered that the control unit 108 further separates the distance between the sample 101 and the column 103 and/or reduces the tilting angle of the sample 101 toward the image capturing apparatus 107. Then, the process proceeds to step S704.

The above is the method of using the chamber scope 501 in the present embodiment. In the second embodiment, when it is determined that a collision of the sample is likely to occur, the movement of the stage 102 is stopped. However, after adjustments are made to prevent a collision, the stage 102 may be continuously moved. Furthermore, the highest point of the sample 101 and the height thereof may be measured by the chamber scope 501, and the image capturing position of the image capturing apparatus 107 may be adjusted in advance. Furthermore, if the determination of the possibility of collision is insufficient, fine adjustment can be made whenever there is an error in the calculation of the distance and the angle according to the determination.

As described above, when the image capturing position of the image capturing apparatus 107 is adjusted, a position relationship between the image capturing apparatus 107 and the sample 101 becomes undefined. FIG. 8 illustrates a schematic view of the case where an image capturing position is adjusted.

In order to prevent the convex portion 601 of the sample 101 from colliding with other components, a method of moving a sample 101 away from the image capturing apparatus 107 (101(a)), a method for moving a sample 101 in a horizontal direction (101(b)), and a method of moving a sample 101 vertically downward (101(c)) or the like can be employed. In the case of the method 101(a), since the distance between the image capturing apparatus 107 and the sample 101 is changed, an optical image becomes smaller than usual, and thus a deviation of the magnification occurs between the optical image and a SEM image. In the case of the method 101(b), a coordinate deviation occurs between an optical image and a SEM image. In the case of the method 101(c), since an optical image becomes smaller than usual, a magnification deviation occurs between the optical image and a SEM image and a coordinate deviation occurs between the optical image and the SEM image. Therefore, in the present embodiment, it is preferable to correct deviations between an optical image and a SEM image by adjusting the image capturing position with the control unit 108.

According to the above configuration, search for the field of view of a SEM image is possible by using an optical image without causing a collision between a sample and other components even for a sample with significant unevenness or a sample with a large diameter.

Third Embodiment

In the third embodiment, a SEM as described in the first embodiment or the second embodiment provided with a detachable detector will be described with reference to FIG. 9.

In a usual SEM, particularly in an out-lens type SEM, a reflection electron detector 901 and a transmission electron detector 902 are arranged right above or right below a sample. In particular, the reflection electron detector 901 is arranged between the column 103 and the sample 101.

In the case of FIG. 9(A), a field of view 111 of the image capturing apparatus 107 is obstructed by the reflection electron detector 901, and thus the sample 101 cannot be placed in the field of view 111. Furthermore, since the reflection electron detector 901 is arranged to be closer to the sample 101 than the column 103 and the like, the possibility of collision when the sample 101 is tilted is increased.

The transmission electron detector 902 does not obstruct the field of view 111 of the image capturing apparatus 107. However, there is a possibility that the sample 101 or the bottom surface of the stage 102 supporting the sample 101 collides with the transmission electron detector 902 when the sample 101 is vertically moved or tilted.

Therefore, in the third embodiment, the reflection electron detector 901 and the transmission electron detector 902 can be retracted from the optical axis of the column 103. As illustrated in FIG. 9(B), the control unit 108 retracts the detectors when using the image capturing apparatus 107. In combination with the second embodiment, by using a chamber scope, detectors may be retracted while determining the height of a sample and the detectors.

According to the above configuration, even in a SEM in which a detector is arranged on the optical axis of the column 103, an image can be captured by the image capturing apparatus 107 without causing a collision between the sample 101, and the stage 102 and the detectors and the like.

Fourth Embodiment

In the fourth embodiment, a SEM capable of capturing an optical image even for a sample having a large diameter will be described.

Although the image capturing apparatus 107 can capture an image at a lower magnification than that of the SEM, there is also an upper limit in the field of view 111 of image capturing apparatus. An image of the entire appearance of a sample whose diameter is larger than the field of view 111 of the image capturing apparatus 107 cannot be capture at once.

Therefore, in the fourth embodiment, in the case of using a sample having a large diameter, an optical image of the entire appearance of the sample 101 is obtained by capturing images while rotating the sample 101 after tilting the sample 101. FIG. 10 illustrates a method of obtaining an optical image according to the fourth embodiment.

When the diameter of the sample 101 is larger than the field of view 111 of the image capturing apparatus 107, the control unit 108 obtains an optical image while rotating the sample 101 in a state where the sample 101 faces toward the image capturing apparatus 107. The expression "while rotating" here refers to both a case where an optical image is obtained while continuously rotating the sample 101 and a case where a process is repeated that an optical image is captured after rotating the sample 101 by a predetermined angle and stopping the sample 101, and, again, the sample is rotated by a predetermined angle and stopped.

In FIG. 10(A), an optical image of the vicinity of the convex portion 601 is obtained. Then, by rotating the sample 101 counterclockwise, an optical image other than the vicinity of the convex portion 601 as illustrated in FIG. 10(B) can be obtained. Hereinafter, by continuing the rotation of the sample 101 until the sample 101 is rotated by one round, an optical image of the entire appearance of the sample 101 can be obtained.

In the fourth embodiment, it is assumed that a sample having a large diameter is used, and thus there is a high possibility that a collision occurs when the sample is tilted. Therefore, by combining with the method of the first, second, or third embodiment, a collision of the sample can be avoided.

In each of the above embodiments, a charged particle beam apparatus including a SEM and an image capturing apparatus has been described as an example. However, the present invention is not limited thereto. For example, a SEM may be replaced with a transmission electron microscope (TEM). Also, a device for processing the sample 101, such as a microtome, an ion milling device, an FIB, and the like may be further provided.

REFERENCE SIGNS LIST

101: sample
102: stage
103: column

104: sample chamber
105: vacuum pump
106: secondary electron detector
107: image capturing apparatus
108: control unit
109: memory
110: monitor
111: field of view of image capturing apparatus
501: chamber scope
601: convex portion
602: field of view of chamber scope
901: reflection electron detector
902: transmission electron detector

The invention claimed is:

1. A charged particle beam apparatus comprising:
a stage configured to place a sample thereon and to move the sample inside a sample chamber;
a column of a scanning electron microscope configured to irradiate a charged particle beam on the sample by outputting the charged particle beam in a direction perpendicular to an upper surface of the stage;
a first image capturing apparatus configured to observe a surface of the sample irradiated with the charged particle beam from an angle different from that of the column and obtain an optical image of the sample; and
a control unit configured to, when observing the sample via the first image capturing apparatus, separate the sample from the column by moving the sample in a vertical direction away from the column and, subsequently, to tilt the sample through the stage to face toward the first image capturing apparatus;
wherein the control unit corrects a magnification and coordinates of the first image capturing apparatus according to a position of the sample when observing the sample by using the first image capturing apparatus.

2. The charged particle beam apparatus according to claim 1, further comprising:
a second image capturing apparatus configured to observe a side surface of the sample; and
a display unit, wherein
the control unit displays an image obtained by the second image capturing apparatus on the display unit when the sample faces toward the first image capturing apparatus.

3. The charged particle beam apparatus according to claim 1, further comprising:
a second image capturing apparatus configured to observe a side surface of the sample, wherein
the control unit determines the possibility of collision between the sample and other components based on an image obtained by the second image capturing apparatus when the sample faces toward the first image capturing apparatus.

4. The charged particle beam apparatus according to claim 3, wherein
the control unit controls the movement of the sample by the stage so as to further separate the sample from the first image capturing apparatus when it is determined that the possibility of collision between the sample and other components is high.

5. The charged particle beam apparatus according to claim 1, wherein
when the sample is larger than the field of view of the first image capturing apparatus, the control unit observes the sample by the first image capturing apparatus while rotating the sample by using the stage.

6. A method of observing a sample comprising:
irradiating the sample in a first position with a charged particle beam from a column of a scanning electron microscope by outputting the charged particle beam in a direction perpendicular to an upper surface of a stage on which the sample is located;
obtaining an optical image of a surface of the sample irradiated with the charged particle beam by a first image capturing apparatus provided in a direction different from that of the column with respect to the sample;
separating the sample from the column by moving the sample in a vertical direction away from the column and, subsequently, tilting the sample to a second position different from the first position such that the sample faces toward the first image capturing apparatus;
observing the sample in the second position by the first image capturing apparatus; and
correcting a magnification and coordinates of the first image capturing apparatus according to a position of the sample when observing the sample by using the first image capturing apparatus.

7. The method of observing a sample according to claim 6, wherein
a side surface of the sample is observed by a second image capturing apparatus, and
in order to observe the sample by the first image capturing apparatus, an image obtained by the second image capturing apparatus is displayed on a display unit when the sample faces toward the first image capturing apparatus.

8. The method of observing a sample according to claim 6, wherein
a side surface of the sample is observed by a second image capturing apparatus, and
when the sample faces toward the first image capturing apparatus, the possibility of collision between the sample and other components is determined from an image obtained by the second image capturing apparatus.

9. The method of observing a sample according to claim 8, wherein
when it is determined that the possibility of collision between the sample and other components is high, the sample is further separated from the first image capturing apparatus.

10. The method of observing a sample according to claim 6, wherein
when the sample is larger than the field of view of the first image capturing apparatus, the sample is observed by using the first image capturing apparatus while rotating the sample.

* * * * *